(12) United States Patent
Lee

(10) Patent No.: US 12,262,521 B2
(45) Date of Patent: *Mar. 25, 2025

(54) MANUFACTURING METHOD OF SEMICONDUCTOR MEMORY DEVICE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/461,291

(22) Filed: Sep. 5, 2023

(65) Prior Publication Data

US 2023/0413506 A1 Dec. 21, 2023

Related U.S. Application Data

(63) Continuation of application No. 17/527,888, filed on Nov. 16, 2021, now Pat. No. 11,751,376, which is a continuation of application No. 16/932,304, filed on Jul. 17, 2020, now Pat. No. 11,205,653.

(30) Foreign Application Priority Data

Jan. 31, 2020 (KR) .................. 10-2020-0011962

(51) Int. Cl.
*H01L 29/88* (2006.01)
*H10B 10/00* (2023.01)

(52) U.S. Cl.
CPC .................. *H10B 10/18* (2023.02)

(58) Field of Classification Search
CPC ................................. H91L 27/11571
USPC ............................................. 257/315
See application file for complete search history.

(56) References Cited

U.S. PATENT DOCUMENTS

| | | | |
|---|---|---|---|
| 10,199,359 B1 | 2/2019 | Sakakibara et al. | |
| 11,205,653 B2 | 12/2021 | Lee | |
| 11,751,376 B2* | 9/2023 | Lee .................. | H10B 43/35 |
| | | | 365/154 |
| 2016/0268302 A1 | 9/2016 | Lee et al. | |
| 2017/0162591 A1 | 6/2017 | Choi | |
| 2017/0162594 A1 | 6/2017 | Ahn | |
| 2018/0006052 A1 | 1/2018 | Hwang | |
| 2018/0138195 A1 | 5/2018 | Lee | |
| 2018/0366486 A1 | 12/2018 | Hada et al. | |
| 2018/0374866 A1 | 12/2018 | Makala et al. | |

(Continued)

FOREIGN PATENT DOCUMENTS

| | | |
|---|---|---|
| CN | 107293544 A | 10/2017 |
| CN | 108074934 A | 5/2018 |

(Continued)

*Primary Examiner* — Hoai V Ho
(74) *Attorney, Agent, or Firm* — WILLIAM PARK & ASSOCIATES LTD.

(57) ABSTRACT

There are provided a semiconductor memory device and a manufacturing method thereof. The semiconductor memory device includes: a first etch stop layer; a source layer on the first etch stop layer; a second etch stop layer on the source layer; a stack structure on the second etch stop layer; and a channel structure penetrating the first and second etch stop layers, the source layer, and the stack structure, the channel structure being electrically connected to the source layer. A material of each of the first and second etch stop layers has an etch selectivity with respect to a material of the source layer.

8 Claims, 15 Drawing Sheets

(56) References Cited

U.S. PATENT DOCUMENTS

| | | | |
|---|---|---|---|
| 2019/0157294 A1 | 5/2019 | Kanamori et al. |
| 2020/0027835 A1 | 1/2020 | Hsu et al. |
| 2020/0152634 A1 | 5/2020 | Lee et al. |
| 2020/0350168 A1 | 11/2020 | Kim et al. |
| 2021/0013222 A1 | 1/2021 | Lee |

FOREIGN PATENT DOCUMENTS

| | | | |
|---|---|---|---|
| CN | 109817633 A | 5/2019 |
| CN | 110289267 A | 9/2019 |
| CN | 110581137 A | 12/2019 |
| CN | 111863831 A | 10/2020 |
| CN | 112928120 A | 6/2021 |
| KR | 1020160109971 A | 9/2016 |
| KR | 1020170036877 A | 4/2017 |
| KR | 1020190109787 A | 9/2019 |

\* cited by examiner

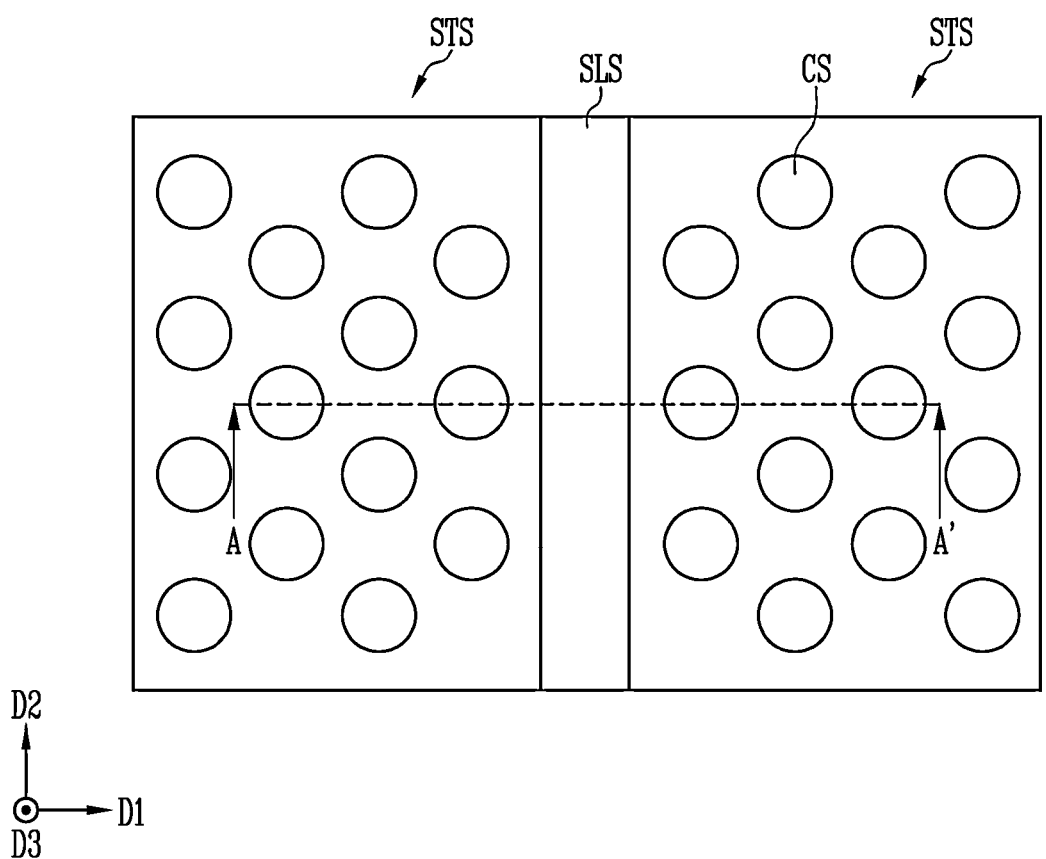

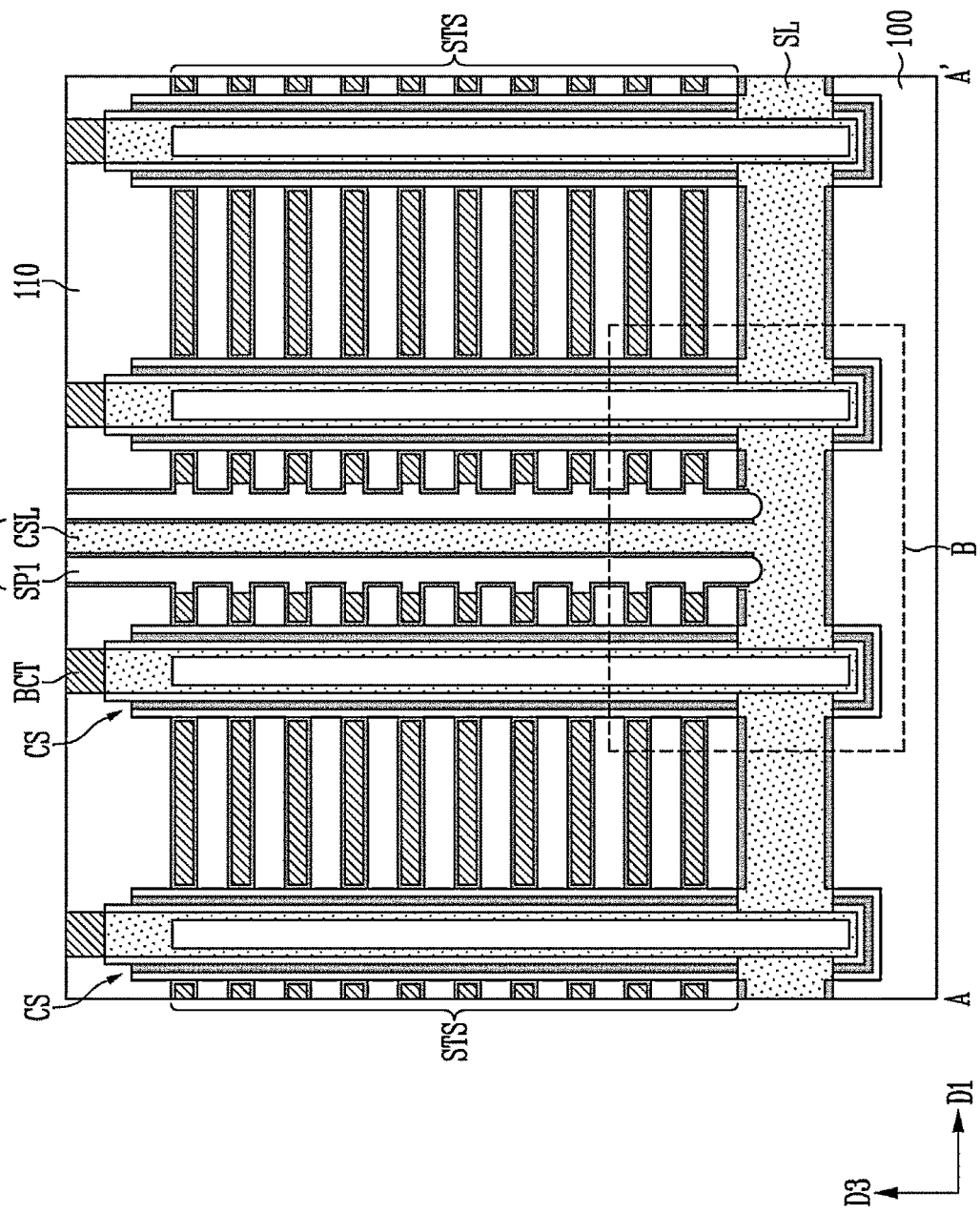

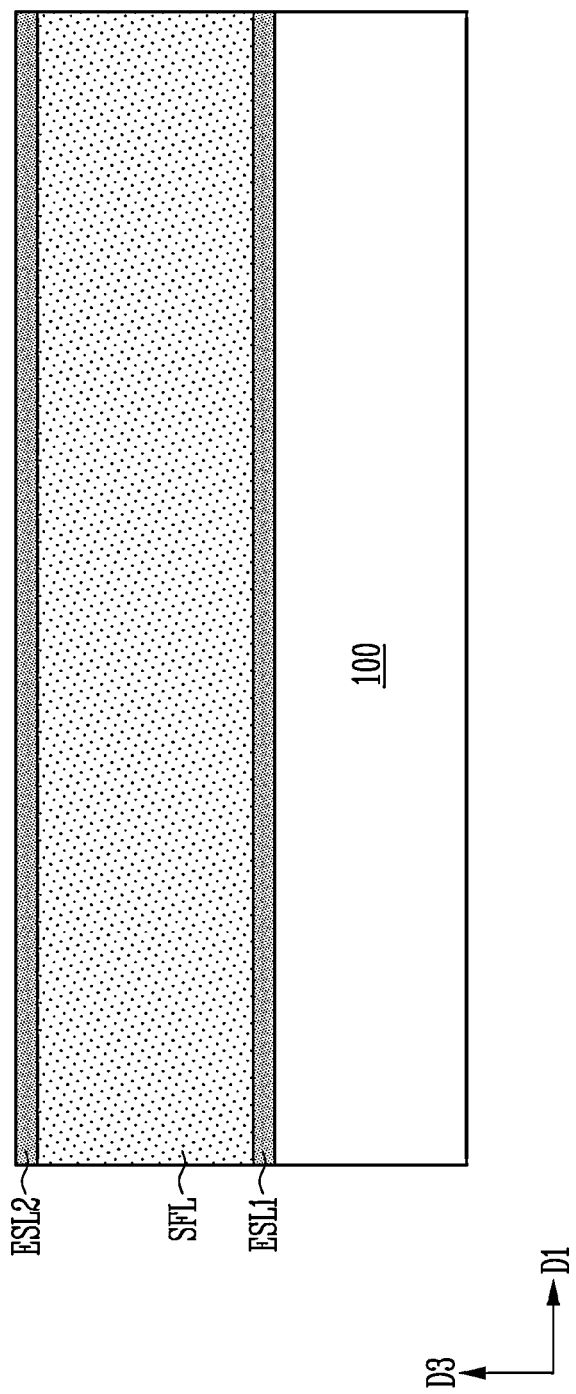

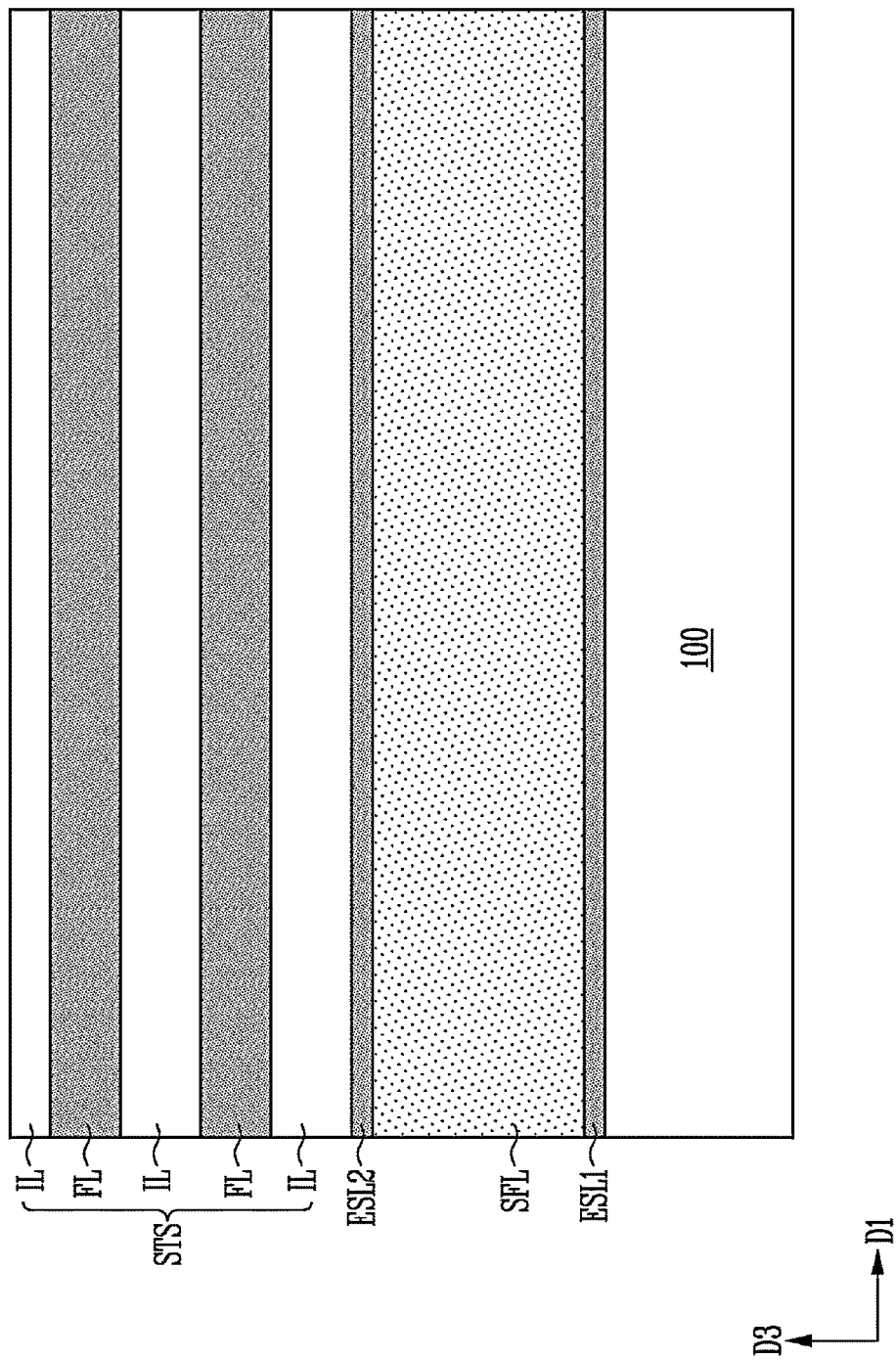

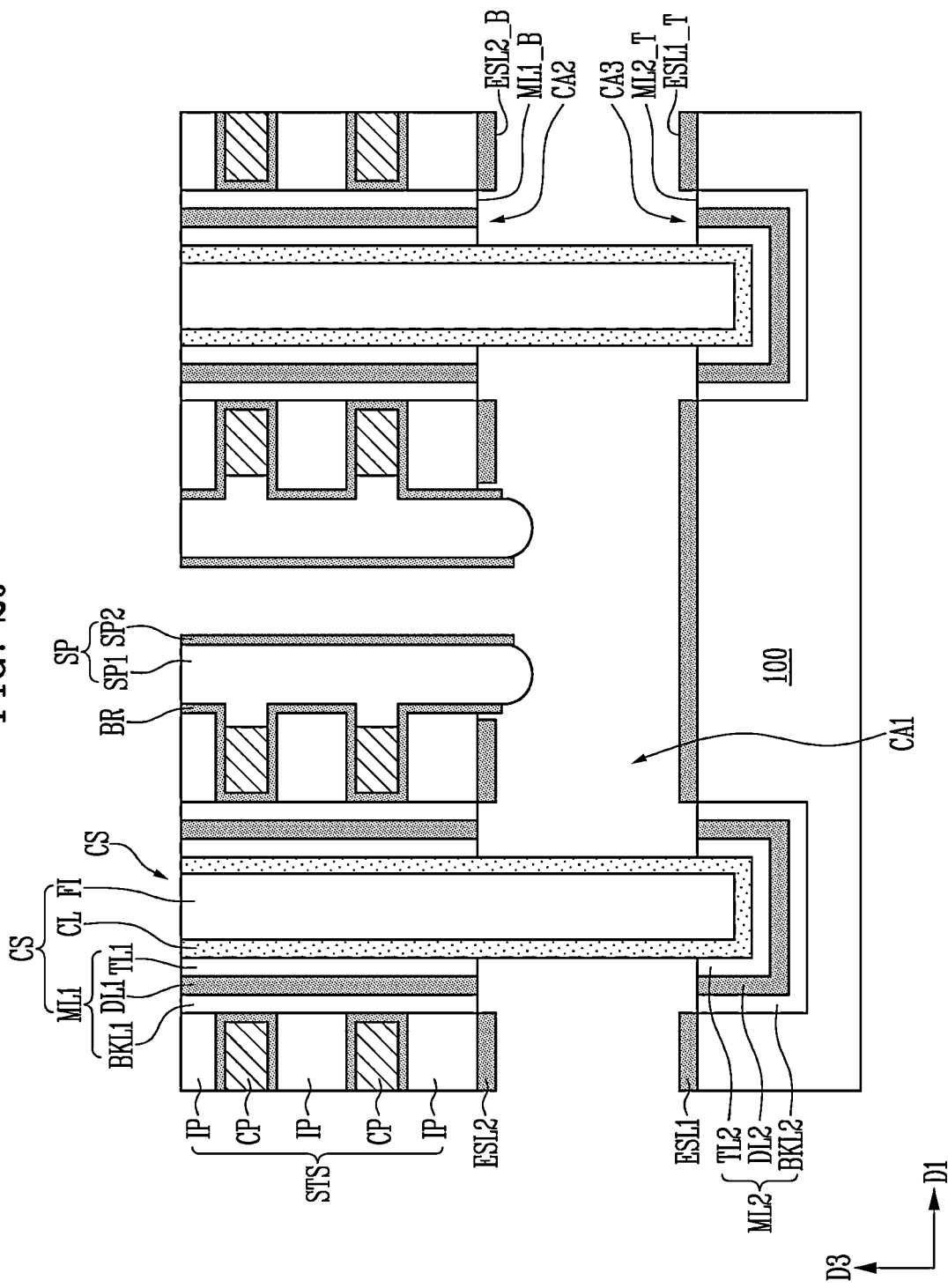

MANUFACTURING METHOD OF SEMICONDUCTOR MEMORY DEVICE

CROSS-REFERENCE TO RELATED APPLICATION

The present application is a continuation application of U.S. patent application Ser. No. 17/527,888, filed on Nov. 16, 2021, which is a continuation application of U.S. patent application Ser. No. 16/932,304, filed on Jul. 17, 2020, and claims priority under 35 U.S.C. § 119(a) to Korean patent application number 10-2020-0011962, filed on Jan. 31, 2020, in the Korean Intellectual Property Office, the entire disclosure of which is incorporated herein by reference.

BACKGROUND

1. Technical Field

The present disclosure generally relates to a semiconductor memory device and a manufacturing method thereof, and more particularly, to a three-dimensional semiconductor memory device and a manufacturing method thereof.

2. Related Art

A semiconductor memory device includes memory cells capable of storing data.

According to a method of storing data and a method of retaining data, the semiconductor memory device may be classified into a volatile semiconductor memory device and a nonvolatile semiconductor memory device. The volatile semiconductor memory device is a memory device in which stored data disappears when the supply of power is interrupted, and the nonvolatile semiconductor memory device is a memory device in which stored data is retained even when the supply of power is interrupted.

Recently, as portable electronic devices are increasingly used, nonvolatile semiconductor memory devices have been increasingly used, and the high integration and large capacity of semiconductor memory devices have been required to achieve portability with large capacity. In order to achieve portability along with large capacity, three-dimensional semiconductor memory devices have been proposed.

SUMMARY

In accordance with an aspect of the present disclosure, there is provided a semiconductor memory device including: a first etch stop layer; a source layer on the first etch stop layer; a second etch stop layer on the source layer; a stack structure on the second etch stop layer; and a channel structure penetrating the first and second etch stop layers, the source layer, and the stack structure, the channel structure being electrically connected to the source layer, wherein a material of each of the first and second etch stop layers has an etch selectivity with respect to a material of the source layer.

In accordance with another aspect of the present disclosure, there is provided a semiconductor memory device including: a base part; a first etch stop layer on the base part; a source layer on the first etch stop layer; a second etch stop layer on the source layer; a stack structure on the second etch stop layer; and a channel structure penetrating the first and second etch stop layers, the source layer, and the stack structure, wherein the channel structure is electrically connected to the source layer, and wherein a lowermost portion of the channel structure is disposed in the base part.

In accordance with still another aspect of the present disclosure, there is provided a method of manufacturing a semiconductor memory device, the method including: forming a base part; sequentially forming, on the base part, a first etch stop layer, a source sacrificial layer, and a second etch stop layer; forming a stack structure, including insulating patterns, on the second etch stop layer; forming a channel structure that penetrates the first and second etch stop layers, the source sacrificial layer, and the stack structure; forming a first trench that penetrates the stack structure and the second etch stop layer; removing the source sacrificial layer; and forming a source layer between the first and second etch stop layers.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1A is a plan view of a semiconductor memory device in accordance with an embodiment of the present disclosure.

FIG. 1B is a sectional view, taken along line A-A', shown in FIG. 1A.

FIGS. 2A to 2K are sectional views, illustrating a manufacturing method of the semiconductor memory device, shown in FIGS. 1A to 1C.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments provide a semiconductor memory device capable of improving operational reliability and a manufacturing method of the semiconductor memory device.

Figure 1C:
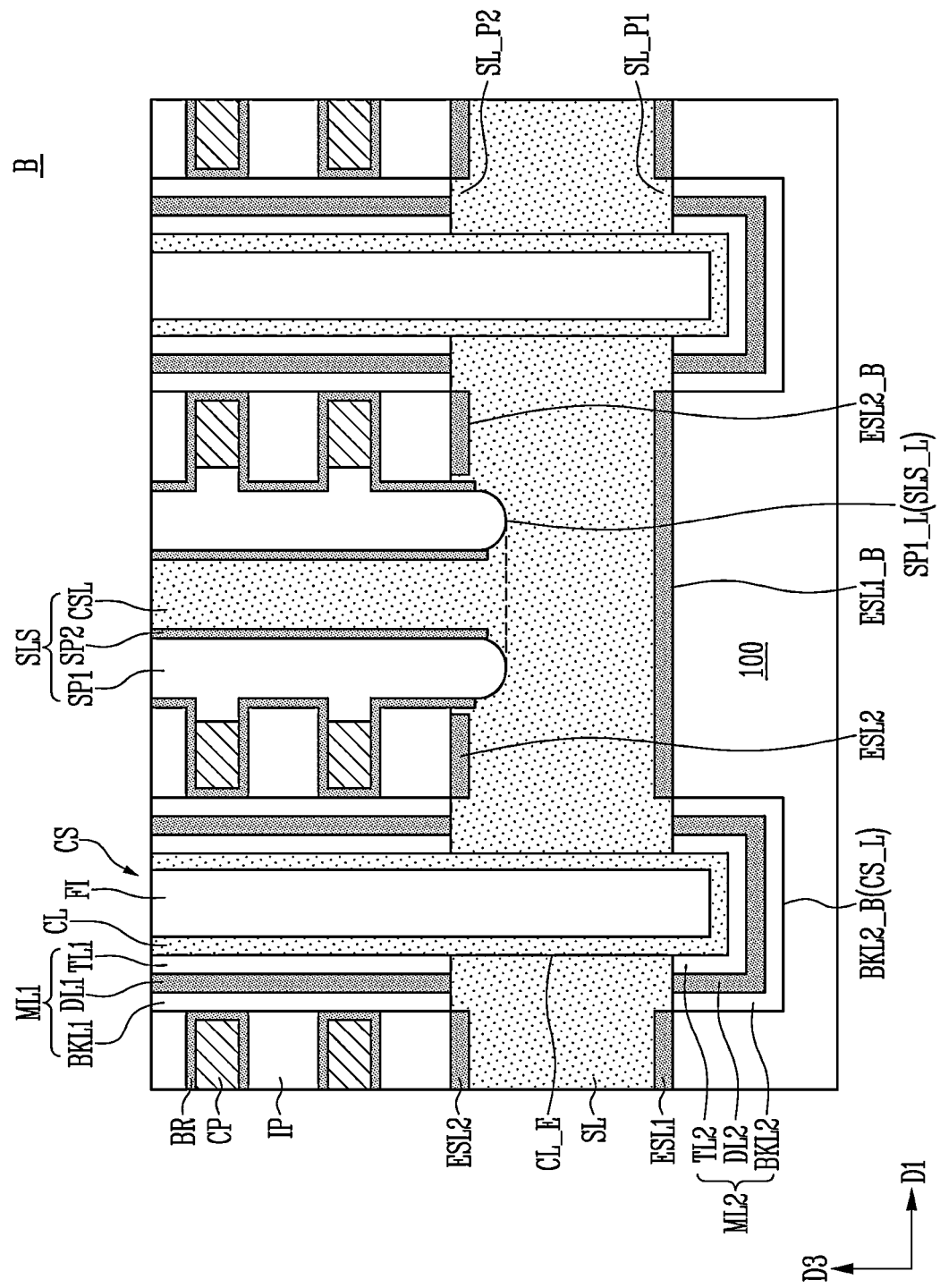
FIG. 1C is an enlarged view of region B shown in FIG. 1B.

FIG. 1A is a plan view of a semiconductor memory device in accordance with an embodiment of the present disclosure. FIG. 1B is a sectional view, taken along line A-A', shown in FIG. 1A. FIG. 1C is an enlarged view of region B shown in FIG. 1B.

Referring to FIGS. 1A to 1C, the semiconductor memory device may include a base part 100. The base part 100 may have the shape of a plate, expanding along a plane that is defined by a first direction D1 and a second direction D2. The first direction D1 and the second direction D2 may intersect each other. In an example, the first direction D1 and the second direction D2 may be perpendicular to each other.

In an example, the base part 100 may be a semiconductor substrate. In an example, the semiconductor substrate may be a bulk silicon substrate, a silicon-on-insulator substrate, a germanium substrate, a germanium-on-insulator substrate, a silicon-germanium substrate, or an epitaxial thin film formed through a selective epitaxial growth process.

In an example, the base part 100 may include peripheral circuit devices, peripheral circuit lines, and a first insulating layer covering the peripheral circuit devices and the peripheral circuit lines. The peripheral circuit devices and the peripheral circuit lines may be provided in a first insulating layer. In an example, the peripheral circuit devices may include devices which constitute a row decoder, a column decoder, a page buffer circuit, and an input/output circuit. The peripheral circuit lines may be electrically connected to the peripheral circuit devices. In an example, the first insulating layer may include an insulating material. In an example, the first insulating layer may include oxide or nitride.

A first etch stop layer ESL1 may be provided on the base part 100, a source layer SL may be provided on the first etch stop layer ESL1, and a second etch stop layer ESL2 may be provided on the source layer SL. The first etch stop layer ESL1, the source layer SL, and the second etch stop layer ESL2 may be sequentially stacked along a third direction D3. The third direction D3 may intersect the first direction D1 and the second direction D2. In an example, the third direction D3 may be perpendicular to the first direction D1 and the second direction D2. The first etch stop layer ESL1 and the second etch stop layer ESL2 may be spaced apart from each other in the third direction D3. The source layer SL may be provided between the first etch stop layer ESL1 and the second etch stop layer ESL2.

Each of the first etch stop layer ESL1, the source layer SL, and the second etch stop layer ESL2 may have the shape of a plate, expanding along a plane that is defined by the first direction D1 and the second direction D2. The first and second etch stop layers ESL1 and ESL2 may include the same material. The material of the first and second etch stop layers ESL1 and ESL2 may have an etch selectivity with respect to the material of the source layer SL. In an example, each of the first and second etch stop layers ESL1 and ESL2 may include an insulating material. In an example, each of the first and second etch stop layers ESL1 and ESL2 may include at least one of SiCO and SiCN. In an example, the source layer SL may include an n-type dopant. In an example, the source layer SL may include doped poly-silicon. The first and second etch stop layers ESL1 and ESL2 may include different materials.

A stack structure STS may be provided on the second etch stop layer ESL2. The stack structure STS may include conductive patterns CP and insulating patterns IP, which are alternately stacked in the third direction D3. An insulating pattern IP may be provided on the second etch stop layer ESL2, and conductive patterns CP and insulating patterns IP may be alternately stacked on the insulating pattern IP.

The insulating patterns IP may include an insulating material. In an example, the insulating patterns IP may include oxide. The conductive patterns CP may include a conductive material. In an example, the conductive patterns CP may include at least one of a doped silicon layer, a metal silicide layer, tungsten, nickel, and cobalt. The conductive patterns CP may be used as a word line that is connected to a memory cell or a select line that is connected to a select transistor.

The stack structure STS may further include barrier layers BR. The barrier layer BR may cover a surface of the insulating pattern IP. The conductive pattern CP and the insulating pattern IP may be spaced apart from each other by the barrier layer BR. In an example, the barrier layer BR may include aluminum oxide.

Channel structures CS, which penetrate the stack structure STS, the second etch stop layer ESL2, the source layer SL, and the first etch stop layer ESL1, may be provided. The channel structures CS may extend in the third direction D3. The channel structure CS may be in contact with the base part 100. The channel structure CS may be in contact with the source layer SL. The channel structure CS may be electrically connected to the source layer SL.

The lowermost portion CS_L of the channel structure CS may be provided in the base part 100. The lowermost portion CS_L of the channel structure CS may be surrounded by the base part 100. The level of the lowermost portion CS_L of the channel structure CS, e.g., a level of a bottom surface BKL2_B of the lowermost portion CS_L, may be lower than that of the top surface of the base part 100 and may be higher than that of a bottom surface of the base part 100. The level of the lowermost portion CS_L of the channel structure CS may be lower than that of a bottom surface ESL1_B of the first etch stop layer ESL1.

Each of the channel structures CS may include a filling layer FI, a channel layer CL that surrounds the filling layer FI, a first memory layer ML1 that surrounds an upper portion and an intermediate portion of the channel layer CL, and a second memory layer ML2 that surrounds a lower portion of the channel layer CL. The first memory layer ML1 and the second memory ML2 may be spaced apart from each other in the third direction D3. The source layer SL may be provided between the first memory layer ML1 and the second memory layer ML2. The first memory layer ML1 may be provided in the stack structure STS. The second memory layer ML2 may be provided in the base part 100. The memory layer ML1 may be disposed at a level that is higher than the second etch stop layer ESL2. The second memory layer ML2 may be disposed at a level that is lower than the first etch stop layer ESL1.

The first memory layer ML1 may include a first tunnel layer TL1 that surrounds the upper portion and the intermediate portion of the channel layer CL, a first storage layer DL1 that surrounds the first tunnel layer TL1, and a first blocking layer BKL1 that surrounds the first storage layer DL1. The second memory layer ML2 may include a second tunnel layer TL2 that surrounds the lower portion of the channel layer CL, a second storage layer DL2 that surrounds the second tunnel layer, and a second blocking layer BKL2 that surrounds the second storage layer DL2.

The first tunnel layer TL1 and the second tunnel layer TL2 may be spaced apart from each other in the third direction D3. The source layer SL may be provided between the first tunnel layer TL1 and the second tunnel layer TL2. The first storage layer DL1 and the second storage layer DL2 may be spaced apart from each other in the third direction D3. The source layer SL may be provided between the first storage layer DL1 and the second storage layer DL2. The first blocking layer BKL1 and the second blocking layer BKL2 may be spaced apart from each other in the third direction D3. The source layer SL may be provided between the first blocking layer BKL1 and the second blocking layer BKL2.

The filling layer FI and the channel layer CL may penetrate the stack structure STS, the second etch stop layer ESL2, the source layer SL, and the first etch stop layer ESL1. The channel layer CL may include an exposed sidewall CL_E that is exposed between the first memory layer ML1 and the second memory layer ML2. The exposed sidewall CL_E may be in contact with the source layer SL. The channel layer CL may be electrically connected to the source layer SL.

The filling layer FI may include an insulating material. In an example, the filling layer FI may include an oxide.

The channel layer CL may include a semiconductor material. In an example, the channel layer CL may include poly-silicon.

The first and second tunnel layers TL1 and TL2 may include a material which charges can tunnel through. In an example, the first and second tunnel layers TL1 and TL2 may include an oxide.

In an example, the first and second storage layers DL1 and DL2 may include a nitride in which charges can be trapped. The material, which the first and second storage layers DL1 and DL2 include, is not limited to the nitride and may be varied, depending on a data storage method. In an example, the first and second storage layers DL1 and DL2 may include silicon, a phase change material, or nano dots.

The first and second blocking layers BKL1 and BKL2 may include a material that is capable of blocking the movement of charges. In an example, a thickness of the first and second blocking layers BKL1 and BKL2 may be thicker than that of the first and second tunnel layers TL1 and TL2.

The first etch stop layer ESL1 may be spaced apart from the channel layer CL. The first etch stop layer ESL1 may be spaced apart from the exposed sidewall CL_E of the channel layer CL. The second etch stop layer ESL2 may be spaced apart from the channel layer CL. The second etch stop layer ESL2 may be spaced apart from the exposed sidewall CL_E.

The source layer SL may include first interposition parts SL_P1 and second interposition parts SL_P2. Portions that are provided between the channel layer CL and the first etch stop layer ESL1 in the source layer SL may be defined as the first interposition parts SL_P1. The first interposition part SL_P1 may be disposed between the channel structure CS and the first etch stop layer ESL1. The first interposition part SL_P1 may have the shape of a ring. The first interposition part SL_P1 may be provided between the exposed sidewall CL_E of the channel layer CL and a sidewall of the first etch stop layer ESL1.

Portions that are provided between the channel layer CL and the second etch stop layer ESL2 in the source layer SL may be defined as the second interposition parts SL_P2. The second interposition part SL_P2 may be disposed between the channel structure CS and the second etch stop layer ESL2. The second interposition part SL_P2 may have the shape of a ring. The second interposition part SL_P2 may be provided between the exposed sidewall CL_E of the channel layer CL and a sidewall of the second etch stop layer ESL2.

The first interposition part SL_P1 may be in contact with the second memory layer ML2. The bottom surface of the first interposition part SL_P1 and the top surface of the second memory layer ML2 may be in contact with each other. The second interposition part CL_P2 may be in contact with the first memory layer ML1. The top surface of the second interposition part SL_P2 may be in contact with the bottom surface of the first memory layer ML1.

The first interposition part SL_P1 and the first etch stop layer ESL1 may be disposed at the same level. In other words, the level of at least a portion of the first interposition part SL_P1 and the level of at least a portion of the first etch stop layer ESL may be the same. The second interposition part SL_P2 and the second etch stop layer ESL2 may be disposed at the same level. In other words, the level of at least a portion of the second interposition part SL_P2 and the level of at least a portion of the second etch stop layer ESL2 may be the same.

A second insulating layer 110 may be provided on the stack structure STS. The second insulating layer 110 may cover the channel structures CS. The second insulating layer 110 may include an insulating material. In an example, the second insulating layer 110 may include an oxide layer.

A slit structure SLS, which penetrates the stack structure STS and the second insulating layer 110 may be provided. The slit structure SLS may extend in the second direction D2. The slit structure SLS may also extend in the third direction D3. The slit structure SLS may penetrate the stack structure STS and the second insulating layer 110 in the third direction D3. The slit structure SLS may be disposed between the channel structures CS. Channel structures CS of a first group and channel structures CS of a second group may be spaced apart from each other in the first direction D1, the slit structure SLS being interposed therebetween. The channel structures CS of the first group and the channel structures CS of the second group may be disposed symmetrically to each other with respect to the slit structure SLS.

The slit structure SLS may penetrate the second etch stop layer ESL2. The slit structure SLS may penetrate the second etch stop layer ESL2 in the third direction D3. The level of the lowermost portion SLS_L may be lower than that of the bottom surface ESL2_B of the second etch stop layer ESL2.

The slit structure SLS may include first spacers SP1, second spacers SP2, and a common source line CSL. The second spacers SP2 may be disposed at both sides of the common source line CSL. The second spacers SP2 may be spaced apart from each other in the first direction D1. The common source line CSL may be provided between the second spacers SP2. The second spacers SP2 may be formed along both sidewalls of the common source line CSL.

The first spacers SP1 may be disposed at both the sides of the common source line CSL. The first spacers SP1 may be spaced apart from each other in the first direction D1. The second spacers SP2 and the common source line CSL may be provided between the first spacers SP1. The first spacer SP1 may be formed along the sidewall of the second spacer SP2.

The common source line CSL may be electrically connected to the source line SL. The common source line CSL may be integrally formed with the source layer SL. In other words, the common source line CSL may be coupled to the source layer SL without any boundary. The common source line CSL and the conductive pattern CP may be electrically isolated from each other by the first spacer SP1 and the second spacer SP2.

Each of the first spacers SP1, the second spacers SP2, and the common source line CSL may extend in the second direction D2 and the third direction D3. Each of the first spacers SP1, the second spacers SP2, and the common source line CSL may penetrate the second etch stop layer ESL2. The first spacer SP1 may have a curved bottom surface. The lowermost portion SP1_L of the first spacer SP1 may be the lowermost portion SLS_L of the slit structure SLS. The level of the lowermost portion SP1_L of the first spacer SP1 may be lower than that of the bottom surface ESL2_B of the second etch stop layer ESL2. The level of the lowermost portion of the second spacer SP2 may be lower than that of the bottom surface ESL2_B of the second etch stop layer ESL2.

The second etch stop layer ESL2 may be spaced apart from the slit structure SLS in the first direction D1. The second etch stop layer ESL2 may be spaced apart from the first spacer SP1 in the first direction D1. The portion of the barrier layer BR may be disposed between the second etch stop layer ESL2 and the slit structure SLS. The portion of the source layer SLS may be disposed between the second etch stop layer ESL2 and the slit structure SLS. The second etch stop layer ESL2 and the slit structure SLS may be spaced apart from each other with the portion of the source layer SL and the portion of the barrier layer BR, interposed therebetween.

The portion of the barrier layer BR may be formed between the insulating patterns IP of the stack structure STS and the first spacer SP1. The portion of the barrier layer BR may penetrate the second etch stop layer ESL2. The level of the lowermost portion of the barrier layer BR may be lower than that of the bottom surface ESL2_B of the second etch stop layer ESL2.

The first spacer SP1 may include a first part that extends in the third direction D3 and second parts that protrude from the first part. The second parts may protrude in the first direction D1 or the opposite direction of the first direction D1 from the first part. The second part may be in contact with the conductive pattern CP.

The first spacer SP1 may include an insulating material. In an example, the first spacer SP1 may include an oxide. The second spacer SP2 may include an insulating material. In an example, the second spacer SP2 may include a nitride. The common source line CSL may include a conductive material. In an example, the common source line CSL may include at least one of doped poly-silicon and tungsten.

Bit line contacts BCT that are connected to the channel structures CS may be provided. The bit line contact BCT may be electrically connected to the channel layer CL. The bit line contact BCT may include a conductive material. In an example, the bit line contact BCT may include tungsten, aluminum, or copper. The bit line contacts BCT may be connected to a bit line.

The material of the first and second etch stop layers ESL1 and ESL2 may have an etch selectivity with respect to the material of each of the source layer SL, the insulating pattern IP, the base part 100, and the first and second spacers SP1 and SP2. The material of the first and second spacers SP1 and SP2 may have an etch selectivity with respect to the material of each of the first and second tunnel layers TL1 and TL2, the first and second storage layers DL1 and DL2, the first and second blocking layers BKL1 and BKL2, and the channel layer CL of the channel structure CS. In an example, the material of the first and second etch stop layers ESL1 and ESL2 may have an etch selectivity with respect to an oxide, a nitride, and a semiconductor material.

In the semiconductor memory device, in accordance with this embodiment, the source layer SL connected to the common source line CSL may be formed in a single layer.

In the semiconductor memory device, the source layer SL may be in contact with the first etch stop layer ESL1 and the second etch stop layer ESL2, and the first etch stop layer ESL1 and the second etch stop layer ESL2 may be formed of an insulating material instead of a semiconductor material. Accordingly, a dopant diffusion path, from the inside of the source layer SL, may be limited to a surface through which the channel layer CL and the source layer SL are in contact with each other. Thus, a dopant diffusion distance in the third direction D3 from the inside of the channel layer CL and a process error in a range of a junction overlap region may be reduced. The reduction of the error range of the junction overlap region allows for the generation of a stable gate induced drain leakage (GIDL) current during an erase operation. Accordingly, the reliability of the semiconductor memory device can be ensured.

FIGS. 2A to 2K are sectional views, illustrating a manufacturing method of the semiconductor memory device, shown in FIGS. 1A to 1C.

For convenience of description, components that are identical to those that are described with reference to FIGS. 1A to 1C are designated by like reference numerals, and overlapping descriptions will be omitted.

A manufacturing method, described below, is merely one embodiment of the manufacturing method of the semiconductor memory device shown in FIGS. 1A to 1C, and the manufacturing method of the semiconductor memory device shown in FIGS. 1A to 1C is not limited to that described below.

Referring to FIG. 2A, a first etch stop layer ESL1, a source sacrificial layer SFL, and a second etch stop layer ESL2 may be sequentially formed on a base part 100. The first etch stop layer ESL1, the source sacrificial layer SFL, and the second etch stop layer ESL2 may be sequentially stacked in a third direction D3. The first and second etch stop layers ESL1 and ESL2 may be spaced apart from each other in the third direction D3, and the source sacrificial layer SFL may be disposed between the first and second etch stop layers ESL1 and ESL2.

In an example, the base part 100 may be a semiconductor substrate. In another example, the base part 100 may be a first insulating layer that includes peripheral circuit devices and peripheral circuit lines. In an example, the first insulating layer may include an insulating material. The source sacrificial layer SFL may include a semiconductor material. In an example, the source sacrificial layer SFL may include poly-silicon. In an example, the first and second etch stop layers ESL1 and ESL2 may include an insulating material. In an example, the first and second etch stop layers ESL1 and ESL2 may include at least one of SiCO and SiCN.

Referring to FIG. 2B, a stack structure STS may be formed on the second etch stop layer ESL2. The stack structure STS may include stack insulating layers IL and stack sacrificial layers FL. The stack insulating layers IL and the stack sacrificial layers FL may be alternately stacked in the third direction D3. A stack insulating layer IL may be provided on the second etch stop layer ESL2, and stack sacrificial layers FL and stack insulating layers FL may be alternately stacked on the stack insulating layer IL.

The stack insulating layers IL and the stack sacrificial layers FL may include an insulating material. In an example, the stack insulating layers IL may include an oxide. In an example, the stack sacrificial layers FL may include a nitride.

Figure 2C:
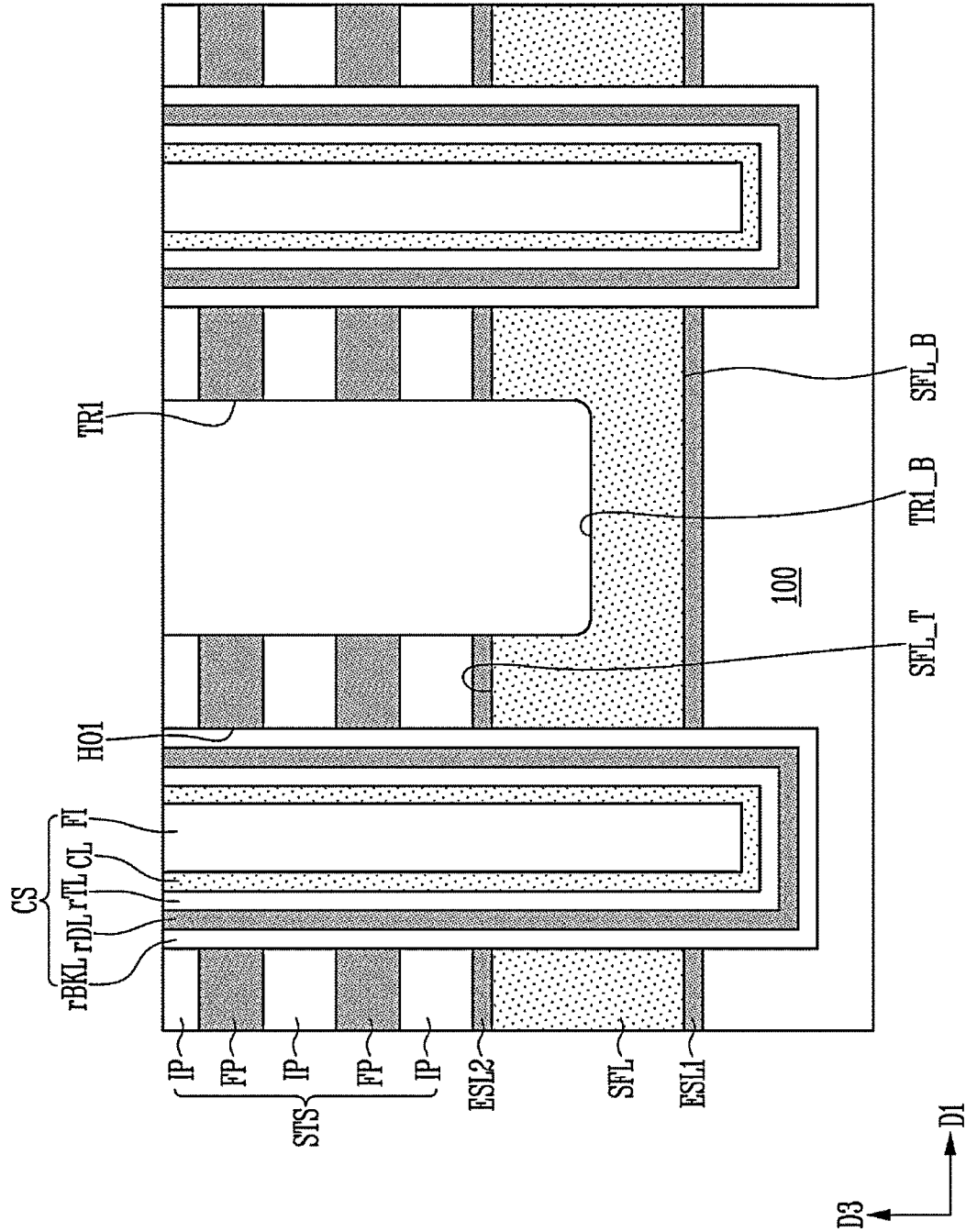

Referring to FIG. 2C, channel structures CS may be formed by penetrating the stack structure STS, the second etch stop layer ESL2, the source sacrificial layer SFL, and the first etch stop layer ESL1. The channel structures CS may penetrate the stack insulating layers IL and the stack sacrificial layers FL of the stack structure STS. The channel structure CS may include a preliminary tunnel layer rTL, a preliminary storage layer rDL, a preliminary blocking layer rBKL, a channel layer CL, and a filling layer FI.

The process of forming the channel structures CS may include a process of forming first holes HO1 that penetrate the stack structure STS, the second etch stop layer ESL2, the source sacrificial layer SFL, and the first etch stop layer ESL1 and a process of sequentially forming, in the first hole HO1, the preliminary tunnel layer rTL, the preliminary storage layer rDL, the preliminary blocking layer rBKL, the channel layer CL, and the filling layer FI. The preliminary tunnel layer rTL may include a material which charges can tunnel through. The preliminary storage layer rDL may include a material in which charges can be trapped. The preliminary blocking layer rBKL may include a material that is capable of blocking the movement of charges.

A first trench TR1 may be formed by penetrating the stack structure STS and the second etch stop layer ESL2. The first trench TR1 may extend in a second direction D2. The first trench TR1 may penetrate the stack insulating layers IL and the stack sacrificial layers FL of the stack structure STS. The bottom surface TR1_B of the first trench TR1 may be located in the source sacrificial layer SFL. The bottom surface TR1_B of the first trench TR1 may be located between the top surface SFL_T and the bottom surface SFL_B of the source sacrificial layer SFL.

Insulating patterns IP and sacrificial patterns FP may be formed by patterning the stack insulating layers IL and the stack sacrificial layers FL based on the process of forming the first holes HO1 and the process of forming the first trench TR1.

Figure 2D:
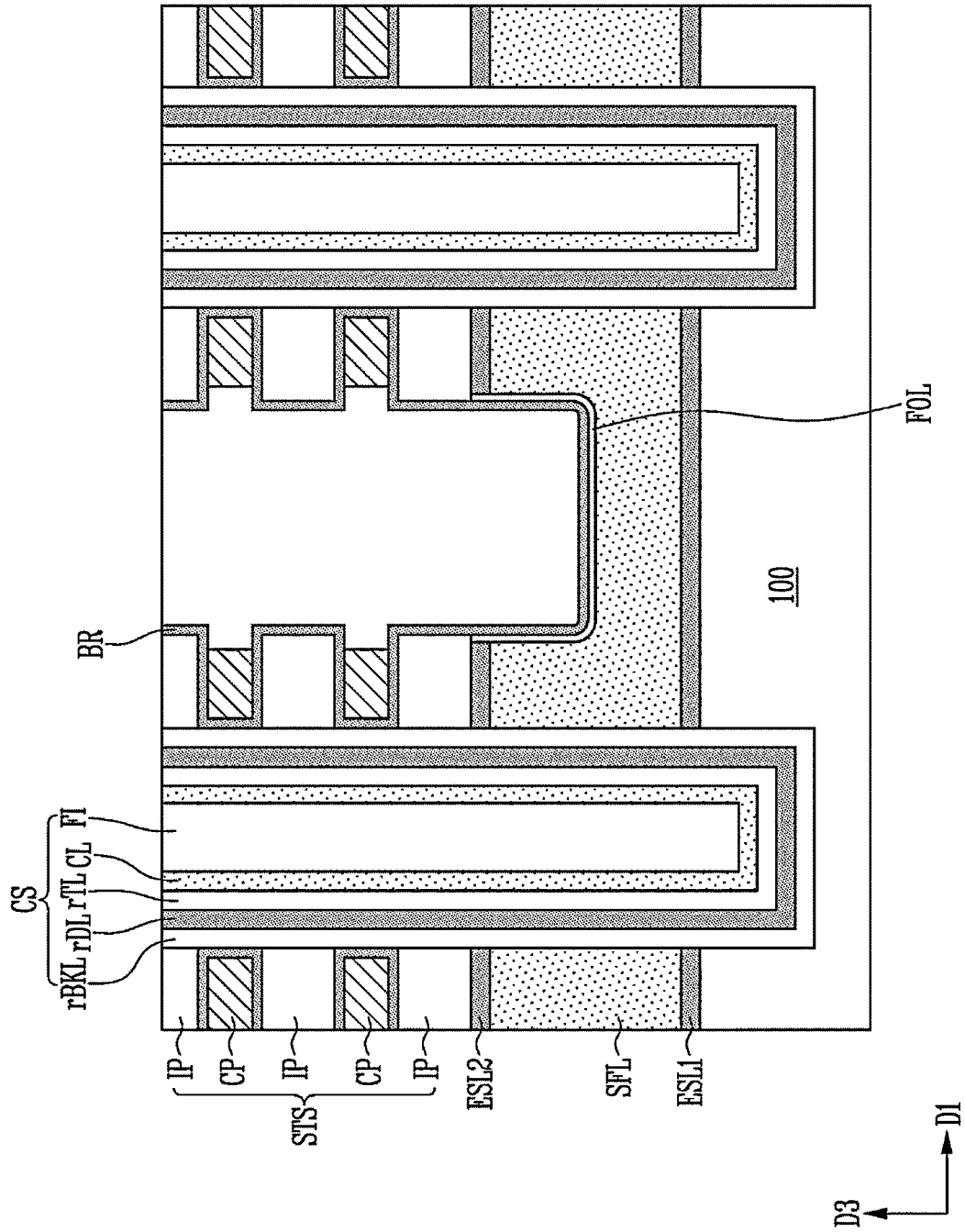

Referring to FIG. 2D, a sacrificial oxide layer FOL, conductive patterns CP, and a barrier layer BR may be formed.

The sacrificial oxide layer FOL may be formed by oxidizing a portion of the second etch stop layer ESL2 and a portion of the source sacrificial layer SFL. A surface of the second etch stop layer ESL2 and a surface of the source sacrificial layer SFL may be oxidized so that the sacrificial oxide layer FOL may be formed. In an example, the surface of the second etch stop layer ESL2 and the surface of the source sacrificial layer SFL may be oxidized by supplying oxygen gas to the first trench TR1. The sacrificial oxide layer FOL may include an insulating material. In an example, the sacrificial oxide layer FOL may include an oxide.

The process of forming the conductive patterns CP and the barrier layer BR may include a process of forming empty spaces between the insulating patterns IP by selectively removing the sacrificial patterns FP, a process of forming the barrier layer BR along surfaces of the insulating patterns IP, a surface of the channel structure CS, and a surface of the sacrificial oxide layer FOL, a process of filling the empty spaces by forming a conductive layer along a surface of the barrier layer BR, and a process of forming the conductive patterns CP by patterning the conductive layer.

The conductive layer may completely fill the empty spaces and may fill a portion of the first trench TR1. Portions of the conductive layer that are formed in the empty spaces may be separated so that the conductive patterns CP are formed.

Figure 2E:
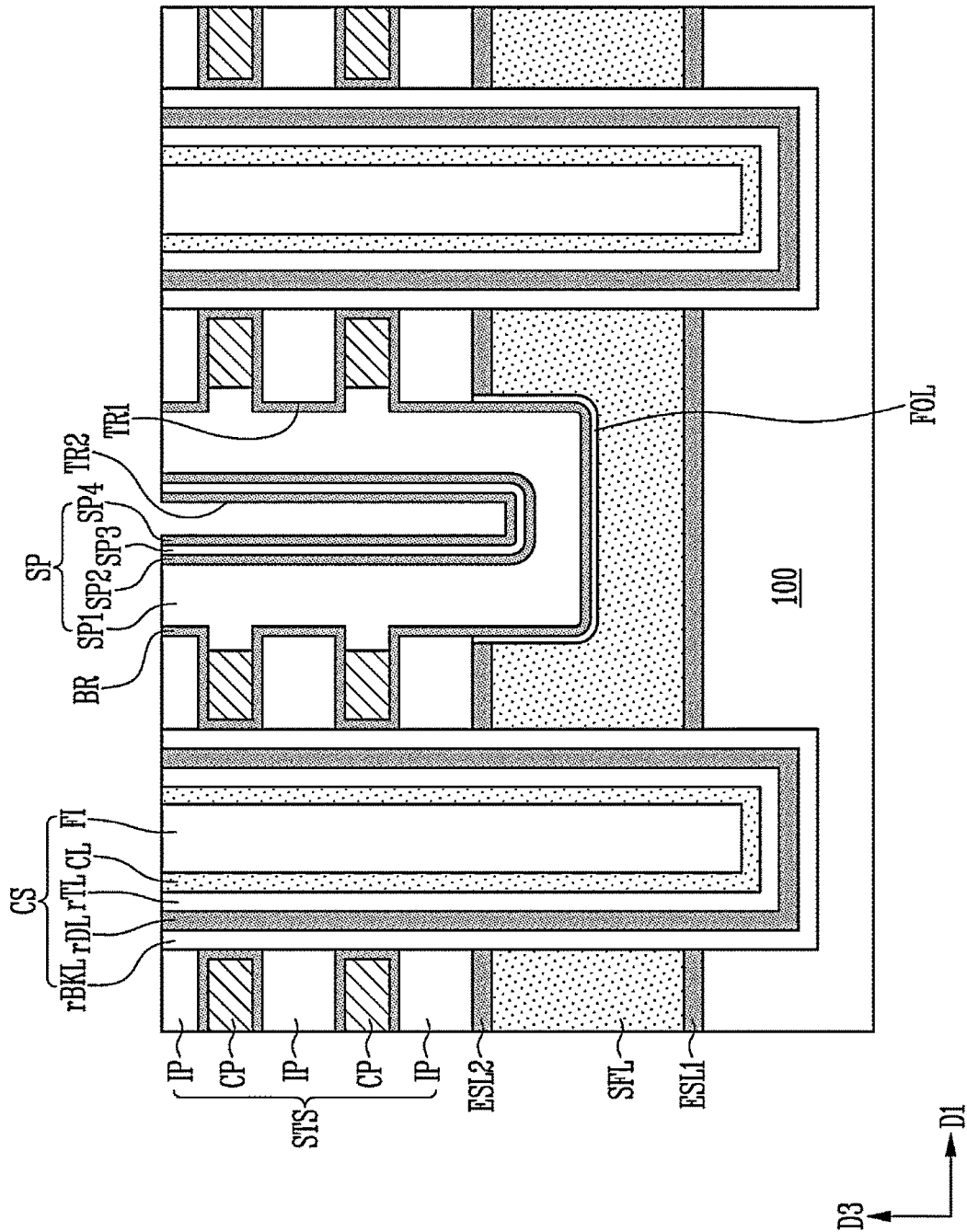

Referring to FIG. 2E, a spacer SP may be formed in the first trench TR1. The spacer SP may include an insulating material. In an example, the spacer SP may include first to fourth spacers SP1, SP2, SP3, and SP4. The process of forming the spacer SP may include a process of forming the first spacer SP1 on surfaces of the barrier layer BR and the conductive patterns CP, a process of forming the second spacer SP2 on a surface of the first spacer SP1, a process of forming the third spacer SP3 on a surface of the second spacer SP2, and a process of forming the fourth spacer SP4 on a surface of the third spacer SP3.

The spacer SP may fill a portion of the first trench TR1. In other words, the spacer SP might not completely fill the first trench TR1. A portion of the first trench TR1, which is not filled by the spacer SP, may be defined as a second trench TR2. The second trench TR2 may extend in the second direction D2. A surface of the fourth spacer SP4 may be exposed by the second trench TR2. The second trench TR2 may be defined by the surface of the fourth spacer SP4.

The first to fourth spacers SP1, SP2, SP3, and SP4 may include an insulating material. In an example, the first and third spacers SP1 and SP3 may include an oxide. In an example, the second and fourth spacers SP2 and SP4 may include nitride.

Figure 2F:
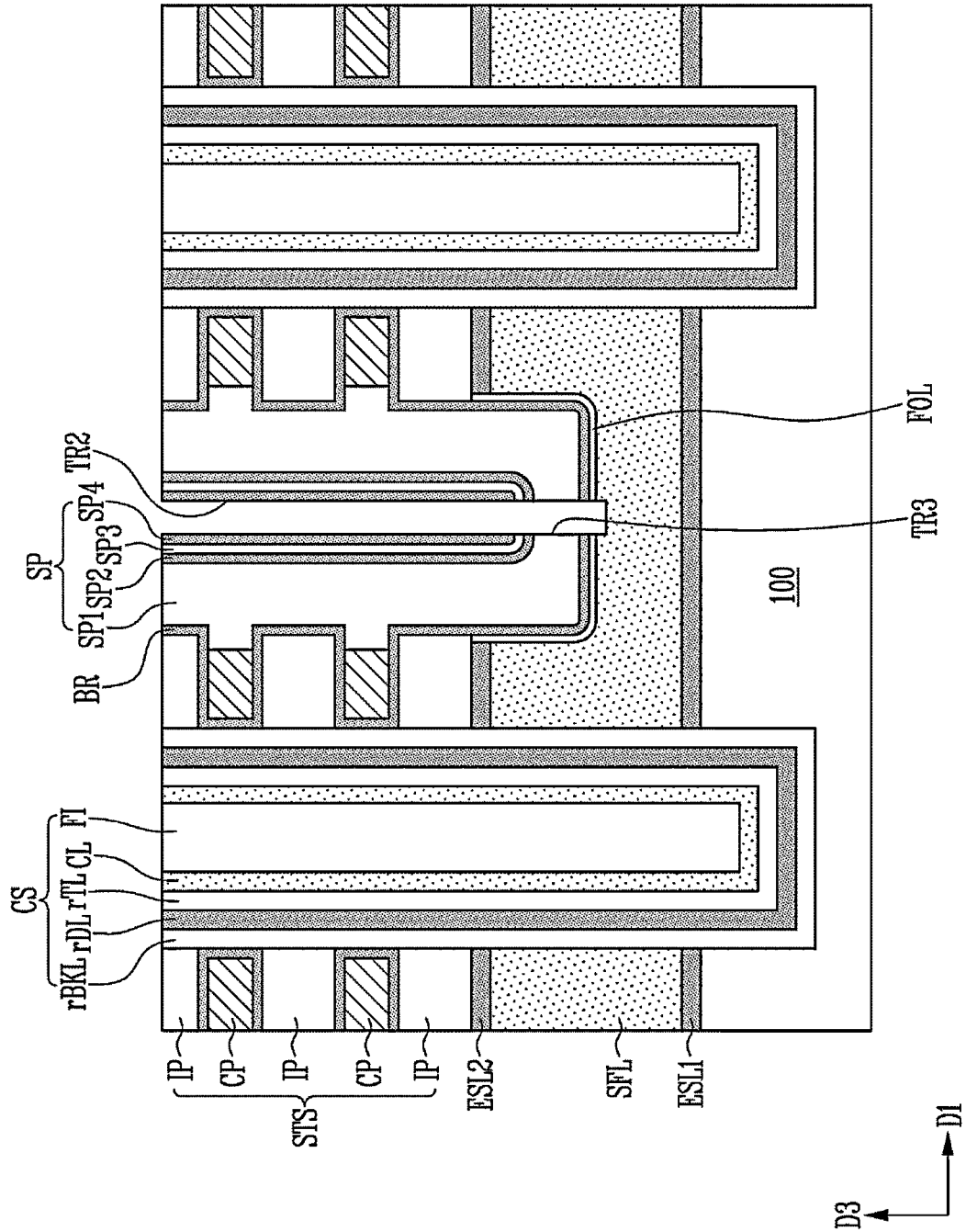

Referring to FIG. 2F, a third trench TR3 may be formed. The third trench TR3 may extend in the second direction D2. The third trench TR may penetrate the spacer SP and the sacrificial oxide layer FOL. The third trench TR3 may penetrate the first to fourth spacers SP1, SP2, SP3, and SP4. A bottom surface of the third trench TR3 may be located in the source sacrificial layer SFL. In an example, the third trench TR3 may be formed through an etch-back process. When the third trench TR3 is formed, the source sacrificial layer SFL may be exposed. The source sacrificial layer SFL may be exposed by the second trench TR2 and the third trench TR3.

Figure 2G:
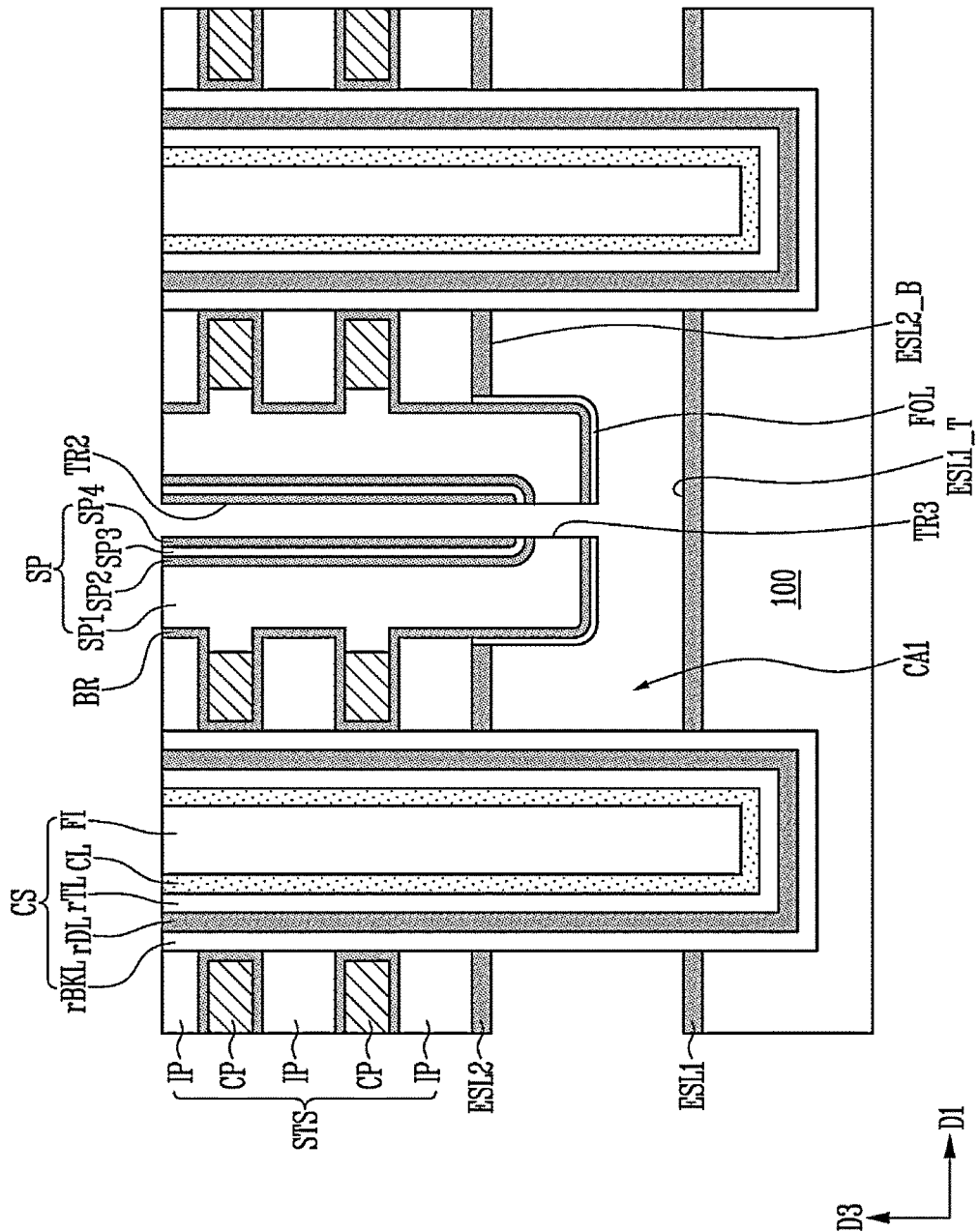

Referring to FIG. 2G, the source sacrificial layer SFL, between the first etch stop layer ESL1 and the second etch stop layer ESL2, may be removed. The source sacrificial layer SFL may include a material that is different from that of the first and second etch stop layers ESL1 and ESL2. The material of the source sacrificial layer SFL may have an etch selectivity with respect to the material of the first and second etch stop layers ESL1 and ESL2. The source sacrificial layer SFL may include a material that is different from that of the sacrificial oxide layer FOL. The material of the source sacrificial layer SOF may have an etch selectivity with respect to the material of the sacrificial oxide layer FOL.

The source sacrificial layer SFL may be removed through an etching process. In an example, the source sacrificial layer SFL may be removed through a wet etching process or a dry etching process. The etching process may be performed using an etching material that is capable of selectively removing the source sacrificial layer SFL. In the process of removing the source sacrificial layer, the first and second etch stop layers ESL1 and ESL2 may be used as an etch stop layer.

When the source sacrificial layer SFL is removed, a first cavity CA1 may be formed. An empty space that is formed by removing the source sacrificial layer SFL may be defined as the first cavity CA1. When the first cavity CA1 is formed, a top surface ESL1_T of the first etch stop layer ESL1 may be exposed, a bottom surface ESL2_B of the second etch stop layer ESL2 may be exposed, and a sidewall of the preliminary blocking layer rBKL of the channel structure CS may be exposed.

Figure 2H:
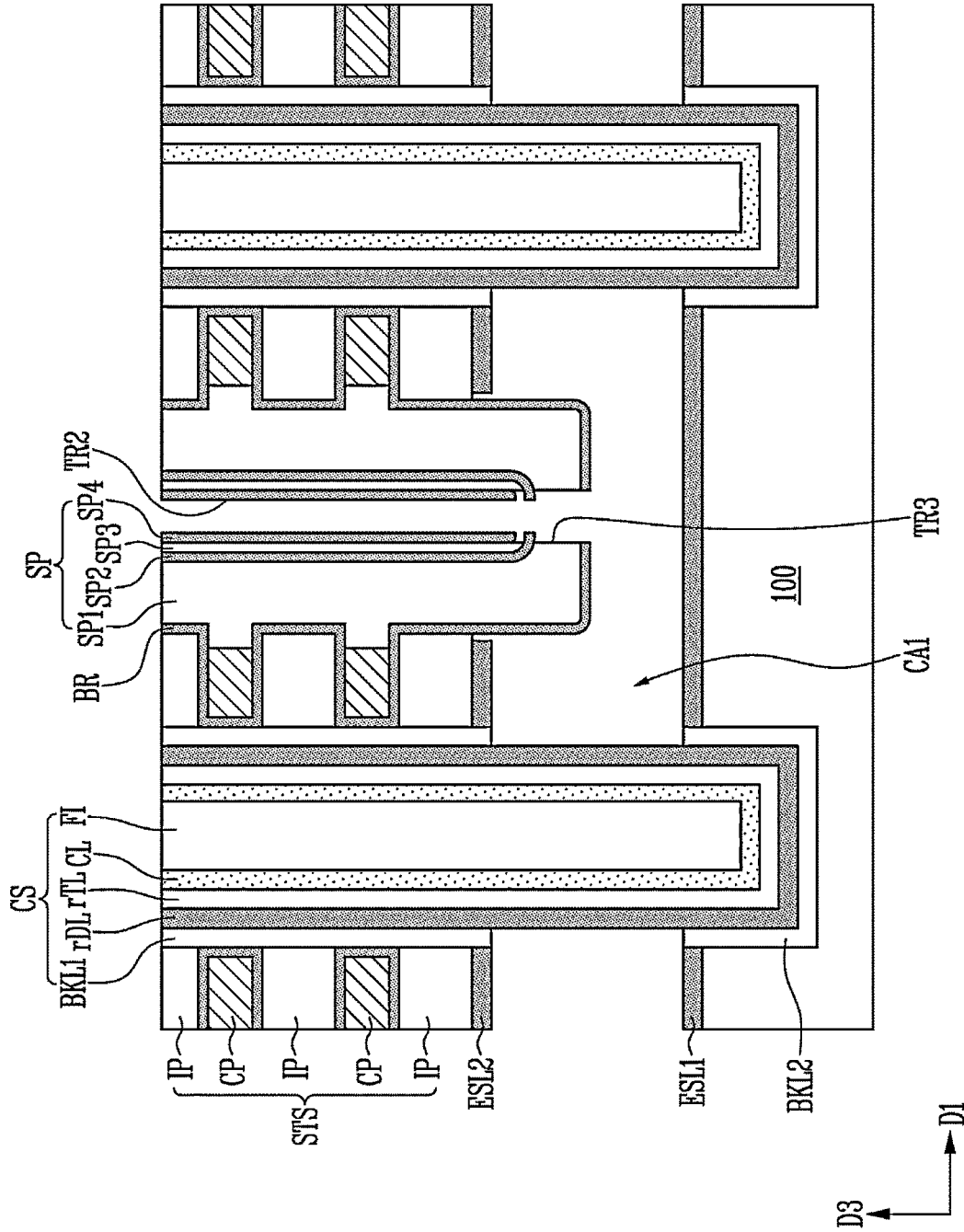
Figure 2I:
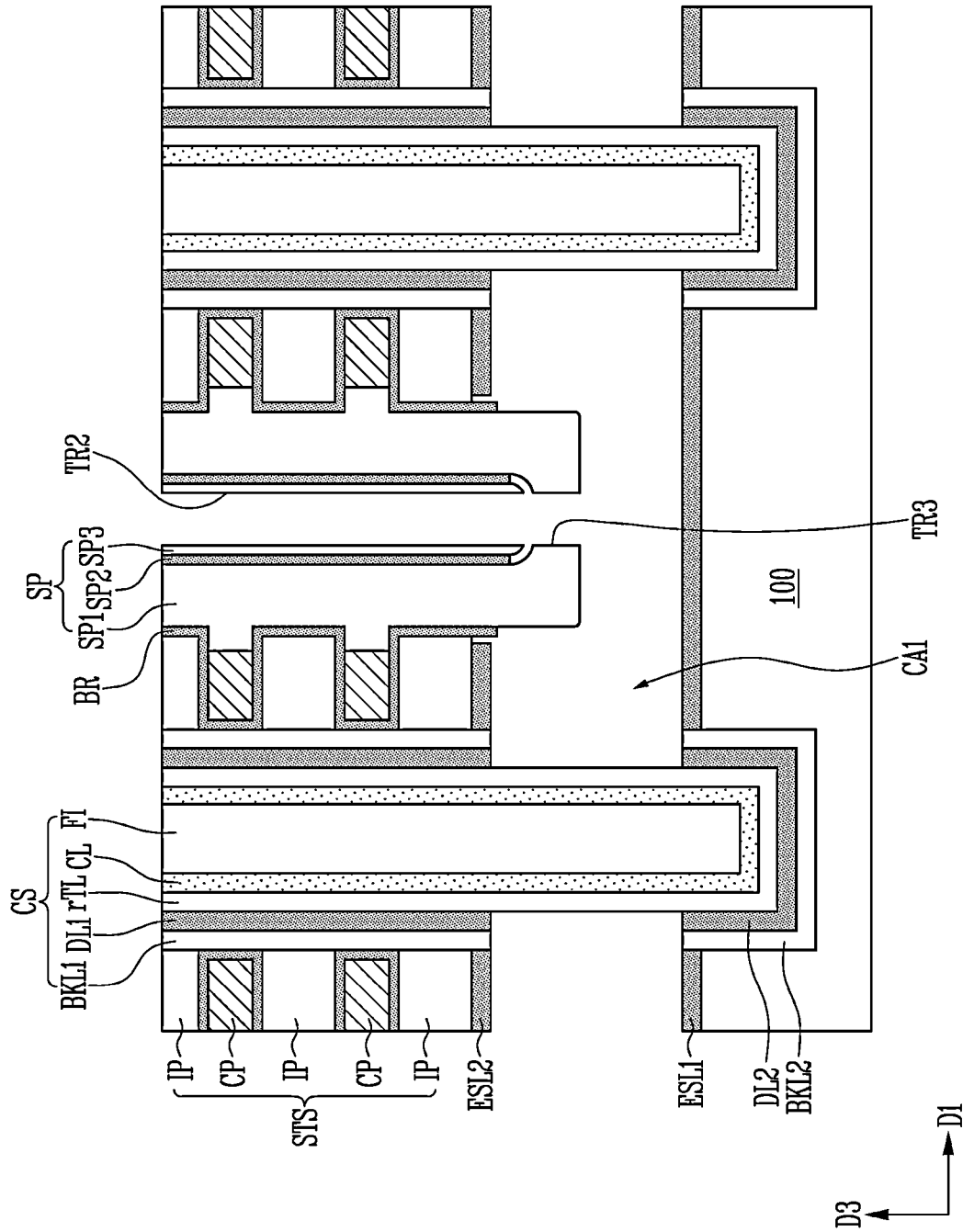

Referring to FIGS. 2H to 2J, the channel structure CS may be patterned. The channel structure CS may be patterned through an etching process. In an example, the channel structure CS may be patterned through a wet etching process or a dry etching process.

While the preliminary blocking layer rBKL, the preliminary storage layer rDL, and the preliminary tunnel layer rTL of the channel structure CS are being etched, the first etch stop layer ESL1 may prevent the base part 100 from being exposed, and the second etch stop layer ESL2 may prevent the insulating pattern IP of the stack structure STS from being exposed.

While the preliminary blocking layer rBKL, the preliminary storage layer rDL, and the preliminary tunnel layer rTL of the channel structure CS are being etched, the first etch stop layer ESL1 may protect the base part 100 from an etching material, and the second etch stop layer ESL2 may protect the insulating pattern IP of the stack structure STS from the etching material. Accordingly, the thickness loss of the base part 100 and the insulating pattern IP may be reduced.

Hereinafter, the patterning of the channel structure CS will be described in more detail.

Referring to FIG. 2H, the preliminary blocking layer rBKL may be patterned. A portion of the preliminary blocking layer rBKL, which is exposed by the first cavity CA1, may be removed. Through the patterning, the preliminary blocking layer rBKL may be separated into a first blocking layer BKL1 and a second blocking layer BKL2. The first blocking layer BKL1 and the second blocking layer BKL2 may be spaced apart from each other in the third direction D3. In an example, the preliminary blocking layer rBKL may be patterned through a wet etching process or a dry etching process.

While the preliminary blocking layer rBKL is being etched, the first etch stop layer ESL1 may prevent the base part 100 from being exposed, and the second etch stop layer ESL2 may prevent the insulating pattern IP of the stack structure STS from being exposed.

While the preliminary blocking layer rBKL is being etched, the first etch stop layer ESL1 may protect the base part 100 from an etching material, and the second etch stop layer ESL2 may protect the insulating pattern IP of the stack structure STS from the etching material.

The sacrificial oxide layer FOL may be removed at the same time as when the preliminary blocking layer rBKL is patterned or through a separate process. The preliminary blocking layer rBKL and the sacrificial oxide layer FOL may include the same material. When the sacrificial oxide layer FOL is removed, an empty space may be formed between the second etch stop layer ESL2 and the barrier layer BR.

Portions of the first spacer SP1 and the third spacer SP3 may be removed at the same time when the preliminary blocking layer rBKL is patterned or through a separate process. The first and third spacers SP1 and SP3 may include the same material as the preliminary blocking layer rBKL. A portion of the first spacer SP1, which is exposed by the third trench TR3, may be removed, and a portion of the third spacer SP3, which is exposed by the third trench TR3, may be removed.

The material of the fourth spacer SP4 may have an etch selectivity with respect to the material of the preliminary blocking layer rBKL. The first to third spacers SP1, SP2, and SP3 may be protected while the preliminary blocking layer rBKL is etched by the fourth spacer SP4.

While the preliminary blocking layer rBKL is being patterned, the first cavity CA1 may be expanded, and a sidewall of the preliminary storage layer rDL may be exposed by the first cavity CA1.

Referring to FIG. 2I, the preliminary storage layer rDL may be patterned. A portion of the preliminary storage layer rDL, which is exposed by the first cavity CA1, may be removed. Through the patterning, the preliminary storage layer rDL may be separated into a first storage layer DL1 and a second storage layer DL2. The first storage layer DL1 and the second storage layer DL2 may be spaced apart from each other in the third direction D3. In an example, the preliminary storage layer rDL may be patterned through a wet etching process or a dry etching process.

While the preliminary storage layer rDL is being etched, the first etch stop layer ESL1 may prevent the base part 100 from being exposed, and the second etch stop layer ESL2 may prevent the insulating pattern IP of the stack structure STS from being exposed.

While the preliminary storage layer rDL is being etched, the first etch stop layer ESL1 may protect the base part 100 from an etching material, and the second etch stop layer ESL2 may protect the insulating pattern IP of the stack structure STS from the etching material.

The fourth spacer SP4 may be removed at the same time when the preliminary storage layer rDL is patterned or through a separate process. The preliminary storage layer rDL and the fourth spacer SP4 may include the same material. When the fourth spacer SP4 is removed, a sidewall of the third spacer SP3 may be exposed.

A portion of the second spacer SP2 may be removed at the same time when the preliminary storage layer rDL is patterned or through a separate process. The preliminary storage layer rDL and the second spacer SP2 may include the same material. A portion of the second spacer SP2, which is exposed by the third trench TR3, may be removed.

The material of the third spacer SP3 may have an etch selectivity with respect to the material of the preliminary storage layer rDL. The first and second spacers SP1 and SP2 may be protected while the preliminary storage layer rDL is being etched by the third spacer SP3.

While the preliminary storage layer rDL is being patterned, the first cavity CA1 may be expanded, and a sidewall of the preliminary tunnel layer rTL may be exposed by the first cavity CA1.

Referring to FIG. 2J, the preliminary tunnel layer rTL may be patterned. A portion of the preliminary tunnel layer rTL, which is exposed by the first cavity CA1, may be removed. Through the patterning, the preliminary tunnel layer rTL may be separated into a first tunnel layer TL1 and a second tunnel layer TL2. The first tunnel layer TL1 and the second tunnel layer TL2 may be spaced apart from each other in the third direction D3. In an example, the preliminary tunnel layer rTL may be patterned through a dry etching process or a wet etching process.

While the preliminary tunnel layer rTL is being etched, the first etch stop layer ESL1 may prevent the base part 100 from being exposed, and the second etch stop layer ESL2 may prevent the insulating pattern IP of the stack structure STS from being exposed.

While the preliminary tunnel layer rTL is being etched, the first etch stop layer ESL1 may protect the base part 100 from an etching material, and the second etch stop layer ESL2 may protect the insulating pattern IP of the stack structure STS from the etching material.

When the preliminary tunnel layer rTL is patterned, a first memory layer ML1 with the first tunnel layer TL1, the first storage layer DL1, and the first blocking layer BKL1 may be formed, and a second memory layer ML2 with the second tunnel layer TL2, the second storage layer DL2, and the second blocking layer BKL2 may be formed. The first memory layer ML1 and the second memory layer ML2 may be spaced apart from each other in the third direction D3.

A portion of the first storage layer DL1 and a portion of the first blocking layer BKL1 between the second etch stop layer ESL2 and the channel layer CL may be removed at the same time as when the preliminary tunnel layer rTL is patterned or through a separate process.

An empty space that is formed between the channel layer and the second etch stop layer ESL2 may be defined as a second cavity CA2. The second cavity CA2 may be defined by a sidewall of the channel layer CL, a sidewall of the second etch stop layer ESL2, and a bottom surface ML1_B of the first memory layer ML1. A lower portion of the second cavity CA2 may be connected to an upper portion of the first cavity CA1. A level of the bottom surface ML1_B of the first memory layer ML1 may be higher than that of the bottom surface ESL2_B of the second etch stop layer ESL2.

A portion of the second storage layer DL2 and a portion of the second blocking layer BKL2 between the first etch stop layer ESL1 and the channel layer CL may be removed at the same time when the preliminary tunnel layer rTL is patterned or through a separate process.

An empty space formed between the channel layer CL and the first etch stop layer ESL1 may be defined as a third cavity CA3. The third cavity CA3 may be defined by the sidewall of the channel layer CL, a sidewall of the first etch stop layer ESL1, and a top surface ML2_T of the second memory layer ML2. An upper portion of the third cavity CA3 may be connected to a lower portion of the first cavity CA1. A level of the top surface ML2_T of the second memory layer ML2 may be lower than that of the top surface ESL1_T of the first etch stop layer ESL1.

The third spacer SP3 may be removed at the same time when the preliminary tunnel layer rTL is patterned or through a separate process. The third spacer SP3 may include the same material as the preliminary tunnel layer rTL. When the third spacer SP3 is removed, a sidewall of the second spacer SP2 may be exposed.

The material of the second spacer SP2 may have an etch selectivity with respect to the material of the preliminary tunnel layer rTL. The first spacer SP1 may be protected by the second spacer SP2 while the preliminary tunnel layer rTL is being etched.

A portion of the first spacer SP1 may be removed at the same time when the preliminary tunnel layer rTL is patterned or through a separate process. When the portion of the first spacer SP1 is removed, the first spacer SP1 may have a curved bottom surface.

Figure 2K:
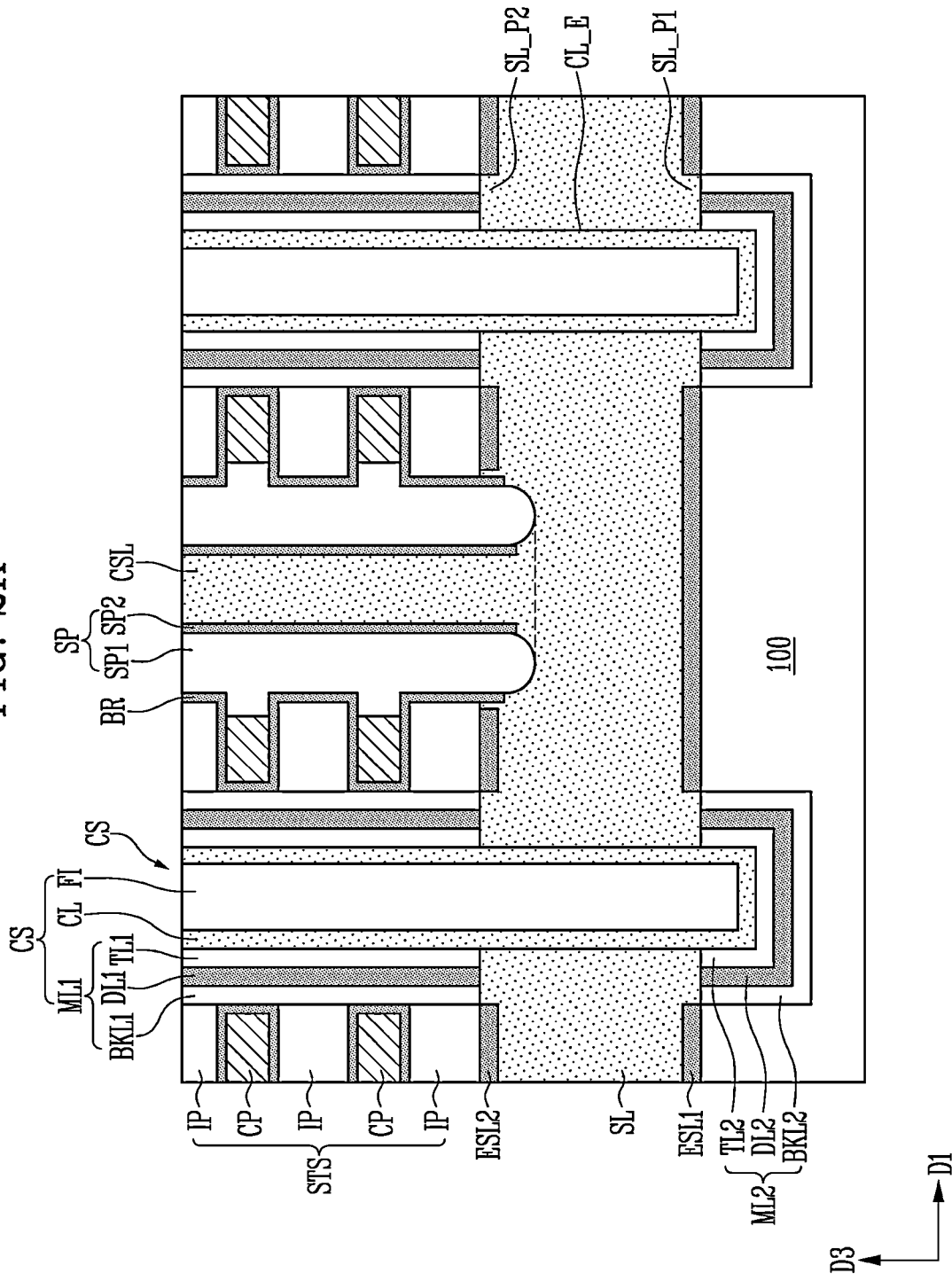

Referring to FIG. 2K, a source layer SL may be formed between the first etch stop layer ESL1 and the second etch stop layer ESL2. The source layer SL may be electrically connected to the channel layer CL of the channel structure CS. The source layer SL may include a second interposition part SL_P2 in the second cavity CA2 and a first interposition part SL_P1 in the third cavity CA3. The source layer SL may be a single layer. In an example, the source layer SL may include an n-type dopant. In an example, the source layer SL may include doped poly-silicon.

The dopant in the source layer SL may be diffused into the channel layer CL through a thermal process. The dopant in the channel layer CL may be diffused in the third direction from a channel sidewall CL_E, to form a junction overlap region.

In the semiconductor memory device, the source layer SL may be in contact with the first etch stop layer ESL1 and the second etch stop layer ESL2, and the first etch stop layer ESL1 and the second etch stop layer ESL2 may be formed of an insulating material instead of a semiconductor material. Accordingly, a dopant diffusion path from the inside of the source layer SL may be limited to a surface through which the channel layer CL and the source layer SL are in contact with each other. Thus, a dopant diffusion distance in the third direction D3 within the channel layer CL and a process error in a range of a junction overlap region may be reduced. As the error range of the junction overlap region is reduced, a stable GIDL current may be generated during an erase operation. Accordingly, the reliability of the semiconductor memory device can be ensured.

Unlike the drawing, a void may be formed in the source layer SL.

A common source line CSL that is connected to the source layer SL may be formed. The common source line CSL may be formed at the same time as when the source line SL is formed or after the source line SL is formed. The common source line CSL may be formed between the first spacers SP1. The common source line CSL may be formed between the second spacers SP2. The common source line CSL may be integrally formed with the source layer SL. In other words, the common source line CSL may be coupled to the source layer SL without any boundary. The common source line CSL may include a conductive material. In an example, the common source line CSL may include at least one of doped poly-silicon and tungsten.

Figure 3:
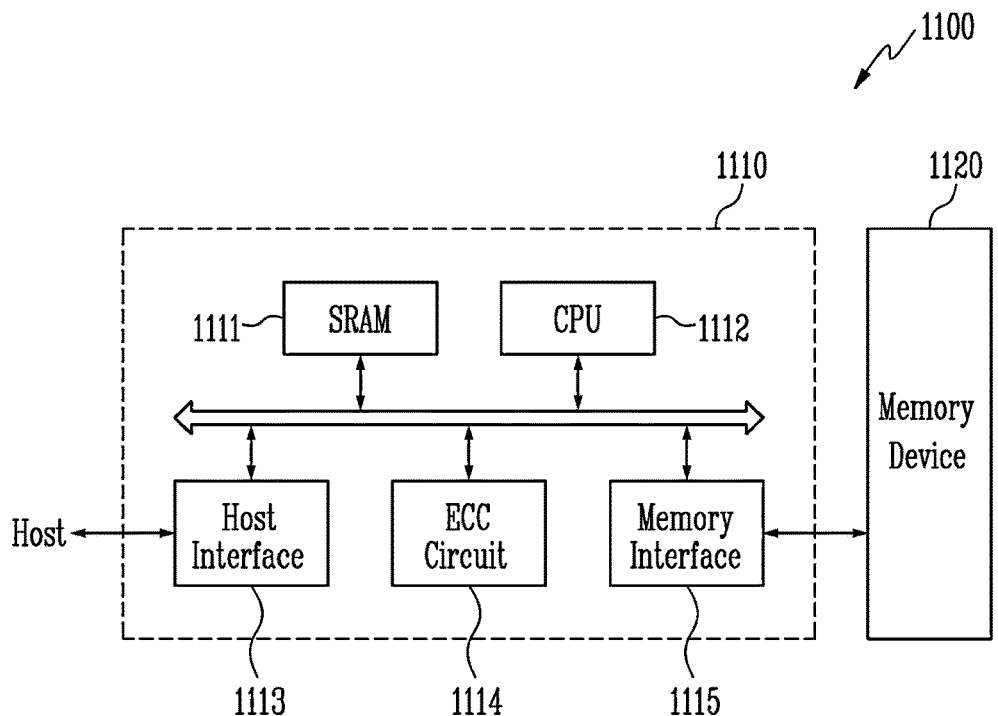
FIG. 3 is a block diagram, illustrating a configuration of a memory system, in accordance with an embodiment of the present disclosure.

FIG. 3 is a block diagram, illustrating a configuration of a memory system, in accordance with an embodiment of the present disclosure.

Referring to FIG. 3, the memory system 1100 may include a memory device 1120 and a memory controller 1110.

The memory device 1120 may include the structure described with reference to FIGS. 1A to 1C. The memory device 1120 may be a multi-chip package that is configured with a plurality of flash memory chips.

The memory controller 1110 may be configured to control the memory device 1120, and may include a Static Random Access Memory (SRAM) 1111, a Central Processing Unit (CPU) 1112, a host interface 1113, an Error Correction Code (ECC) circuit 1114, and a memory interface 1115. The SRAM 1111 may be used as an operation memory of the CPU 1112, the CPU 1112 may perform overall control operations for data exchange of the memory controller 1110, and the host interface 1113 may include a data exchange protocol for a host that is connected with the memory system 1100. The ECC circuit 1114 may detect and correct an error, included in a data, read from the memory device 1120, and the memory interface 1115 may interface with the memory device 1120. In addition, the memory controller 1110 may further include an ROM for storing code data for interfacing with the host, and the like.

The memory system 1100, configured as described above, may be a memory card or a Solid State Disk (SSD), in which the memory device 1120 is combined with the controller 1110. For example, when the memory system 1100 is an SSD, the memory controller 1100 may communicate with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 4:
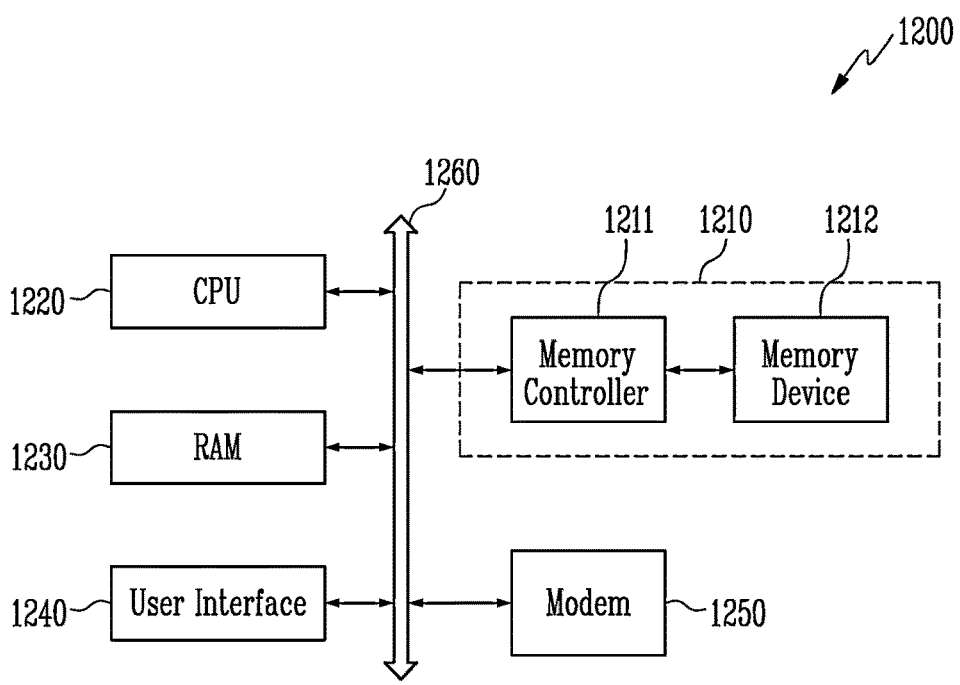
FIG. 4 is a block diagram, illustrating a configuration of a computing system, in accordance with an embodiment of the present disclosure.

FIG. 4 is a block diagram, illustrating a configuration of a computing system, in accordance with an embodiment of the present disclosure.

Referring to FIG. 4, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1210 may be configured with a memory device 1212 and a memory controller 1211, as described with reference to FIG. 3.

In the semiconductor memory device, the first etch stop layer may be in contact with the top surface of the source layer, and the second etch stop layer is in contact with the bottom surface of the source layer. Thus, the dopant in the source layer might not diffuse through the top surface and the bottom surface of the source layer, but may be diffused into only the channel layer through the sidewall of the source layer. Accordingly, the operational reliability of the semiconductor memory device may be improved.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A method of manufacturing a semiconductor memory device, the method comprising:
   forming a base part;
   sequentially forming, over the base part, a first etch stop layer, a source sacrificial layer, and a second etch stop layer;
   forming a stack structure, including insulating patterns and sacrificial patterns, over the second etch stop layer;
   forming a channel structure that penetrates the stack structure, the second etch stop layer, the source sacrificial layer, and the first etch stop layer, wherein a portion of the channel structure is disposed in a portion of the base part;
   forming a trench that penetrates the stack structure and the second etch stop layer, wherein sides of the insulating patterns and the sacrificial patterns are exposed through the trench;
   removing the sacrificial patterns between the insulating patterns;
   forming conductive patterns between the insulating patterns;
   removing the source sacrificial layer; and
   forming a source layer between the first and second etch stop layers.

2. The method of claim 1, wherein a material of the insulating patterns has an etch selectivity with respect to a material of each of the first and second etch stop layers.

3. The method of claim 1, wherein a material of the base part has an etch selectivity with respect to a material of each of the first and second etch stop layers.

4. The method of claim 1, further comprising etching the channel structure,
   wherein, while the channel structure is being etched, the first etch stop layer protects the base part from being etched.

5. The method of claim 1, further comprising etching the channel structure,
   wherein, while the channel structure is being etched, the second etch stop layer protects the insulating patterns from being etched.

6. The method of claim 1, wherein the first and second etch stop layers include at least one of SiCO and SiCN.

7. The method of claim 1, wherein the base part is a semiconductor substrate.

8. The method of claim 1, wherein the base part includes a peripheral circuit device and an insulating layer that covers the peripheral circuit device.

* * * * *